United States Patent
Wakagi et al.

(10) Patent No.: US 8,026,535 B2
(45) Date of Patent: Sep. 27, 2011

(54) THIN FILM TRANSISTOR AND ORGANIC ELECTROLUMINESCENCE DISPLAY USING THE SAME

(75) Inventors: Masatoshi Wakagi, Hitachinaka (JP); Junichi Hanna, Yokohama (JP)

(73) Assignees: Hitachi, Ltd., Tokyo (JP); Tokyo Institute of Technology, Tokyo (JP)

( * ) Notice: Subject to any disclaimer, the term of this patent is extended or adjusted under 35 U.S.C. 154(b) by 723 days.

(21) Appl. No.: 12/019,146

(22) Filed: Jan. 24, 2008

(65) Prior Publication Data

US 2008/0258148 A1 Oct. 23, 2008

(30) Foreign Application Priority Data

Mar. 22, 2007 (JP) ................................. 2007-074574

(51) Int. Cl.
*H01L 21/28* (2006.01)
*H01L 29/78* (2006.01)

(52) U.S. Cl. ............... 257/192; 257/19; 257/55; 257/59; 257/65; 257/66; 257/72; 257/288; 257/347; 257/E21.101; 257/E21.102; 257/E21.103; 257/E29.056; 257/E29.085; 257/E33.001; 438/151; 438/166; 438/197; 438/199; 438/285

(58) Field of Classification Search ........ 257/19, 257/55, 59, 65, 66, 72, 192, 288, 347, E21.101, 257/E21.102, E21.103, E29.056, E29.085, E33.001; 438/151, 166, 197, 199, 285

See application file for complete search history.

(56) References Cited

U.S. PATENT DOCUMENTS

| 5,565,031 A | 10/1996 | Cabral et al. |
| 5,879,970 A | 3/1999 | Shiota et al. |
| 2003/0071307 A1* | 4/2003 | Noguchi et al. ............... 257/347 |
| 2004/0126958 A1* | 7/2004 | Usuda et al. .................. 438/217 |
| 2004/0235264 A1* | 11/2004 | Forbes .......................... 438/429 |

FOREIGN PATENT DOCUMENTS

| JP | 07-307302 | 11/1995 |
| JP | 8-264440 | 10/1996 |
| JP | 10-83964 | 3/1998 |
| JP | 11-274080 | 10/1999 |
| JP | 2001-68422 | 3/2001 |
| JP | 2002-231958 | 8/2002 |

* cited by examiner

*Primary Examiner* — Dao Nguyen
(74) *Attorney, Agent, or Firm* — Antonelli, Terry, Stout & Kraus, LLP.

(57) ABSTRACT

In a thin film transistor, a semiconductor layer containing Si and Ge is applied, a Ge concentration of this semiconductor layer is high at the side of the insulating substrate, and crystalline orientation of the semiconductor layer indicates a random orientation in a region of 20 nm from the side of the insulating substrate, and indicates a (111), (110) or (100) preferential orientation at the film surface side of the semiconductor layer.

9 Claims, 3 Drawing Sheets

THIN FILM TRANSISTOR AND ORGANIC ELECTROLUMINESCENCE DISPLAY USING THE SAME

BACKGROUND OF THE INVENTION

The present invention relates to a thin film transistor containing Si and Ge, and an organic electroluminescence display using the same.

As a thin film transistor (hereafter referred to as "TFT") with high mobility, which is applicable to a peripheral circuit such as an organic electroluminescence display or liquid crystal display (LCD) or the like, there is a poly-Si TFT, where polycrystalline Si is applied to a semiconductor layer. In particular, there is a method for applying polycrystalline SiGe, which is introduced with Ge, to the semiconductor layer. In JP-A-2002-231958, a configuration, where Ge is segregated in a crystal grain boundary to enhance mobility characteristics, has been disclosed.

SUMMARY OF THE INVENTION

However, in the background art, it is difficult to form a polycrystalline SiGe film showing high mobility at low temperature. Therefore, it becomes difficult to form an element on low-price glass substrates having low softening temperature. To solve this problem, there is also a method for applying laser anneal. This case, however, has a drawback of high fabricating process cost, caused by an increase of the laser anneal step. In addition, it also has a drawback of increased maintenance cost of a laser.

It is an object of the present invention to provide a TFT having good mobility characteristics, by formation of a high quality polycrystalline thin film, without using laser anneal at low temperature, along with to provide a display using this TFT, to solve these problems.

In the present invention, such a configuration was taken that Ge concentration is high at the insulating substrate side. Such Ge concentration distribution can be evaluated by RBS (Rutherford Back Scattering) or the like. By setting Ge concentration high at the insulating substrate side, it becomes possible to generate crystalline nuclei at the early stage of film formation at low temperature. In addition, to promote isotropic growth so that the substrate side surface can be covered with the crystalline nuclei, orientation of a crystal plane was controlled so as to become random. Further, the Ge concentration at the film surface side was decreased. Still further, a crystal plane at the film surface side was set to take (110), (111) or (100) orientation. These crystal orientations can be evaluated by X-ray diffraction. By taking such a structure, fine growth of crystal grains can be attained.

To obtain such a film structure, a film was formed by using reactive thermal CVD using $GeF_4$ and $Si_2H_6$. In particular, to increase the Ge concentration at the insulating substrate side, concentration of $GeF_4$ gas to be introduced at the early stage of film formation was increased. By such increase in this concentration, the crystalline nuclei having random orientation and high Ge concentration could be formed at low temperature such as 450° C. Subsequently, by lowering the $GeF_4$ concentration, and optimizing a $Si_2H_6$ flow, flow rate of carrier gas like He or the like, and gas pressure and the like, a semiconductor film showing good crystalline property, high orientation and low Ge concentration can be formed.

A TFT shown in FIG. 1 was formed by using this semiconductor film. A high quality crystal film can be formed without using the laser anneal step for this TFT. In addition, by application of this TFT to a driving circuit of an organic electroluminescence display, it is possible to provide the organic electroluminescence display in low cost. In addition, by application of this TFT to a driving circuit or a peripheral circuit of a liquid crystal display, it is possible to provide the liquid crystal display in low cost.

By increasing the Ge concentration, crystallization temperature can be lowered, and good quality crystalline nuclei can be formed at low temperature. In addition, by setting random orientation, the substrate surface side can be covered with the crystalline nuclei. Furthermore, freedom in selection of preferential growth face is extended after that, and the growth face can be controlled by adjusting the film formation condition.

In the present invention, the crystal plane at the film surface side was controlled to (110), (111) or (100) orientation. By taking such a structure, fine growth of crystal grains can be attained. By this effect, a defect level density of a gate insulating film interface can be lowered, and thus a TFT with stable characteristics such as small shift of threshold value (Vth) can be provided. In addition, by decreasing the Ge concentration, an off-current of a TFT can be lowered.

In addition, a TFT of the present invention can be formed at low temperature, and also the laser anneal is not required. Therefore, a display can be produced in low cost.

Other objects, features and advantages of the invention will become apparent from the following description of the embodiments of the invention taken in conjunction with the accompanying drawings.

DETAILED DESCRIPTION OF THE EMBODIMENTS

Explanation will be given below on embodiments of the present invention with reference to drawings.

Embodiment 1

Figure 1:
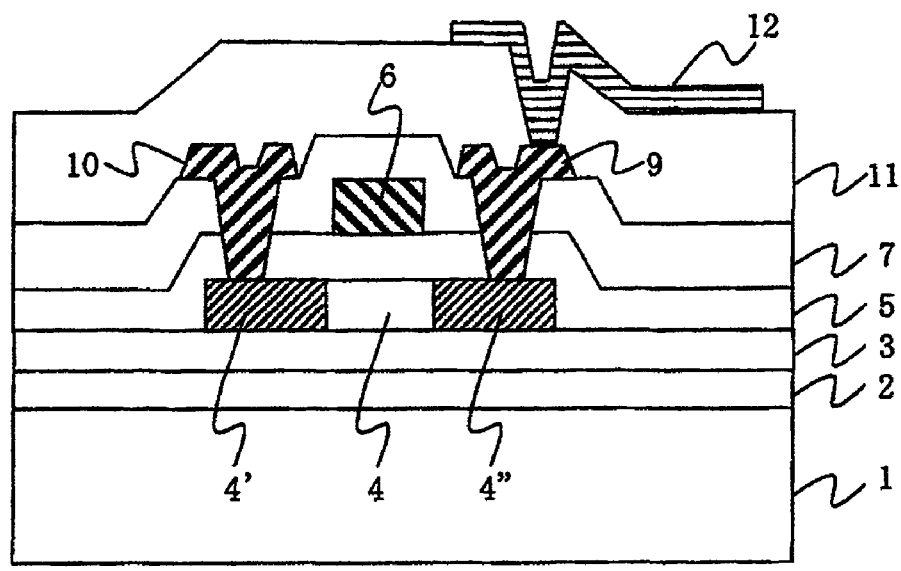
FIG. 1 is a schematic cross-sectional drawing of a top-gate type TFT.

FIG. 1 is a schematic cross-sectional drawing of a top-gate type TFT relevant to the present invention. In FIG. 1, a SiN film 2 and a $SiO_2$ film 3 were formed as base layers on the insulating substrate 1 by a PECVD (Plasma Enhanced CVD) method. A polycrystalline SiGe film was formed thereon as a semiconductor layer 4. For this SiGe film, such a configuration was applied, having a high Ge concentration and indicated random crystal orientations in a region of equal to or smaller than 20 nm at the substrate side, while having a low Ge concentration and indicated (110) orientation in a region of a film thickness of equal to or larger than 40 nm.

Here, the Ge concentration in a region of equal to or smaller than 20 nm at the substrate side is equal to or more than 10 atomic %, preferably equal to or more than 15 atomic %. By setting the Ge concentration in this region equal to or more than 10 atomic %, a crystalline property was indicated for film formation at 450° C., and by setting the concentration equal to or more than 15 atomic %, a crystal fraction became equal to or more than 95%. Therefore, by setting Ge concentration in this region equal to or more than 10 atomic %, a good crystalline film can be formed at the region with a film thickness of equal to or more than 20 nm, which is formed thereon.

Further, it was found that, by setting the Ge concentration equal to or more than 15 atomic %, mobility of a TFT showed equal to or more than 5 cm$^2$/Vs, even when a bottom-gate type TFT was formed. By application of the TFT with this mobility, it is also possible to drive an organic electroluminescence element.

In addition, in a region of a film thickness of equal to or larger than 40 nm, the Ge concentration was set equal to or less than 20 atomic %, and preferably equal to or less than 15 atomic %. By setting the Ge concentration equal to or less than 20 atomic %, off-current of a TFT can be reduced to equal to or less than $10^{-10}$ A, and thus it is applicable to a drive circuit of the organic electroluminescence display. Further, by setting the concentration equal to or less than 15 atomic %, the off-current can be reduced to equal to or less than $10^{-12}$ A, and thus it is possible to obtain high picture quality images with low leak-current, even when applied to a pixel drive of a liquid crystal display.

In addition, by setting the region with a film thickness of equal to or smaller than 20 nm to be a random orientation, not only the crystalline property can be enhanced but also an orientation of a film formed thereon can be controlled by film formation condition. In this case, it is desirable that, as peak intensities of X-ray diffraction, a (220) peak intensity is equal to or more than 0.5 times, and equal to or less than 0.7 times of a (111) peak intensity, a (311) peak intensity is equal to or more than 0.2 times, and equal to or less than 0.4 times of the (111) peak intensity, and a (400) peak intensity is equal to or more than 0.05 times, and equal to or less than 0.07 times of the (111) peak intensity.

Further, in the case where a crystalline orientation in a region, having a film thickness of equal to or larger than 40 nm, is set (110), a highly fine film can be formed by setting the (220) peak intensity of the X-ray diffraction is equal to or more than 0.8 times of the (111) peak intensity. On the other hand, in the case where the (111) orientation is set, it is desirable that the (111) peak intensity is equal to or more than 2.2 times of the (220) peak intensity. In addition, in the case where a (100) orientation is set, it is desirable that the (400) peak intensity is equal to or more than 0.1 times of the (111) peak intensity. By setting such structures, a semiconductor with higher fineness can be formed.

To form this SiGe film, a reactive thermal CVD method was used. In this method, a substrate is heated at a temperature of equal to or more than 450° C., and GeF$_4$, Si$_2$H$_6$ and He are introduced. The SiGe film with good film quality can be formed by setting flow ratio of GeF$_4$ and Si$_2$H$_6$ within a range of 0.005 to 2:1, and flow ratio of Si$_2$H$_6$ and He within a range of 1:10 to 5000.

To prepare the above film configuration, first of all, as for the flow ratio of GeF$_4$ and Si$_2$H$_6$, a GeF$_4$ flow was set equal to or more than 0.1, as setting a Si$_2$H$_6$ flow 1, and was introduced, and then this ratio was lowered to form a film. To make a Ge ratio of equal to or less than 20 atomic % for a film thickness of equal to or more than 40 nm, this ratio is set equal to or less than 0.1. In addition, pressure or the gas flow rate is changed. By applying such a two step film formation, a SiGe film with the above film configuration can be formed.

In the case where a top-gate type TFT is formed, a SiGe film as the semiconductor layer 4 is fabricated to an island-like shape by using photolithography. Then, a gate insulating layer 5 is formed thereon. As a material for the gate insulating layer 5, SiO$_2$, SiN or the like is included. These films are formed by using PECVD or a sputtering method or the like. In addition, plasma oxidation, photo-oxidation or the like may be used in combination. A gate electrode wiring 6 is formed thereon. As a material for the gate electrode wiring 6, Si, Ge or an alloy thereof, Nb, Mo, W, Ta, Cr, Ti, Fe, Ni, Co or the like or an alloy thereof is included. Then, by using photolithography, it was fabricated to a gate electrode wiring pattern.

Thereafter, by ion implantation, P or B was implanted to form a drain doped region 4' and a source doped region 4". A SiO$_2$ film or a SiN film, as an interlayer insulating layer 7, was formed thereon by the above method, and then contact holes were formed by using photolithography. Then, through these contact holes, a source electrode wiring 9 and a drain electrode wiring 10 were formed. As a material for these electrode wirings, Nb, Mo, W, Ta, Cr, Ti, Fe, Ni, Co or the like or an alloy thereof is included. Then, it was fabricated to a source electrode wiring pattern and a drain electrode wiring pattern by the photolithography method.

Further, after formation of a SiN film as a protective insulating film 11 thereon by using photolithography, a contact hole was formed. Then, a reflecting metal plate or a transparent conductive film was formed for a pixel electrode 12, and was fabricated by using photolithography.

Figure 2:
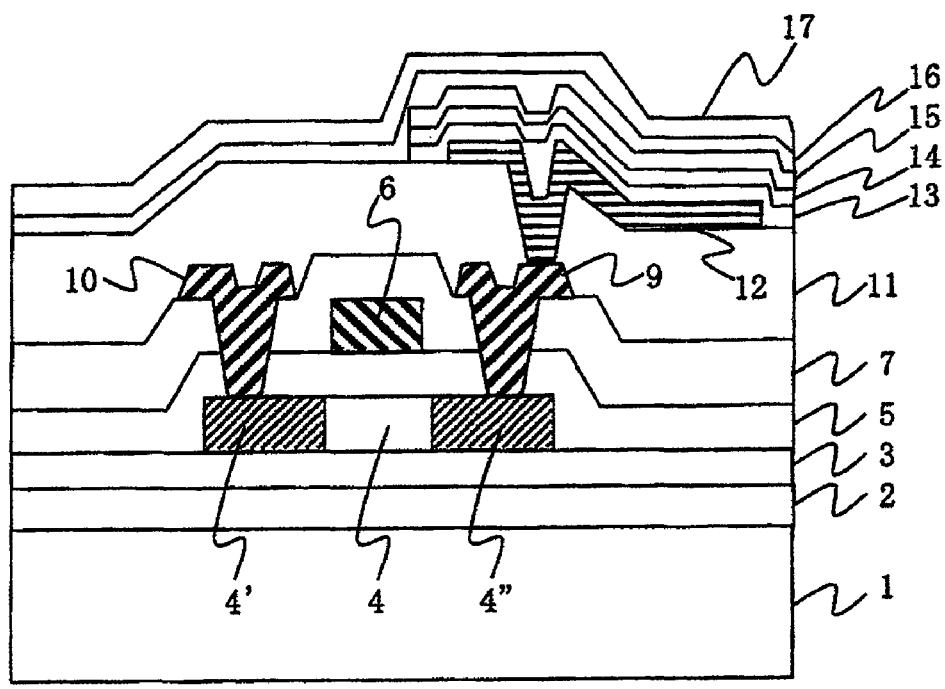
FIG. 2 is a schematic cross-sectional drawing of an organic electroluminescence display using a top-gate type TFT.

In the case where an organic electroluminescence display is formed, as shown in FIG. 2, a charge transport layer 13 of an organic electroluminescence, a luminescent layer 14, and a charge transport layer 15 were formed thereon by using a vapor deposition method or the like, and further, a transparent conductive film was formed as an upper electrode 16, by using evaporation, sputtering method or the like, and a SiN film was formed as a sealing layer 17, to prepare an organic electroluminescence display. The organic electroluminescence display thus prepared showed characteristics of high brightness and long life-time, because of good stability of the TFT.

Figure 3:
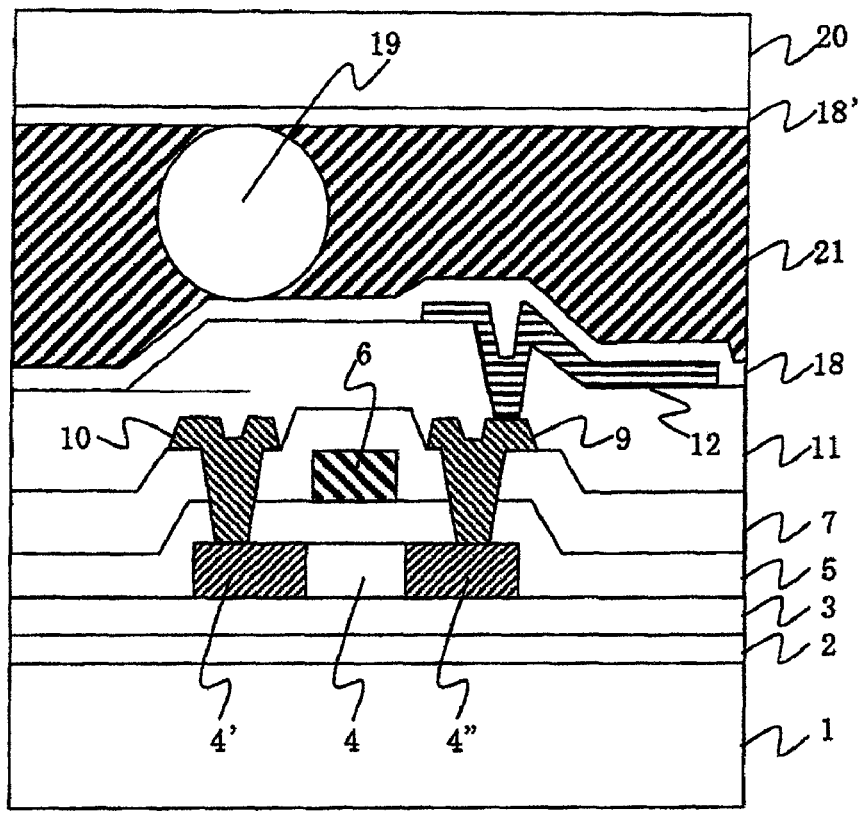
FIG. 3 is a schematic cross-sectional drawing of a liquid crystal display using a top-gate type TFT.

In addition, in the case where a liquid crystal display is formed, as shown in FIG. 3, an alignment film 18 was formed on the pixel electrode 12, an opposed substrate 20 was adhered via a spacer 19, and a liquid crystal 21 was encapsulated to prepare a TFT liquid crystal display. Thus fabricated TFT liquid crystal display showed a highly fine image.

Figure 4:
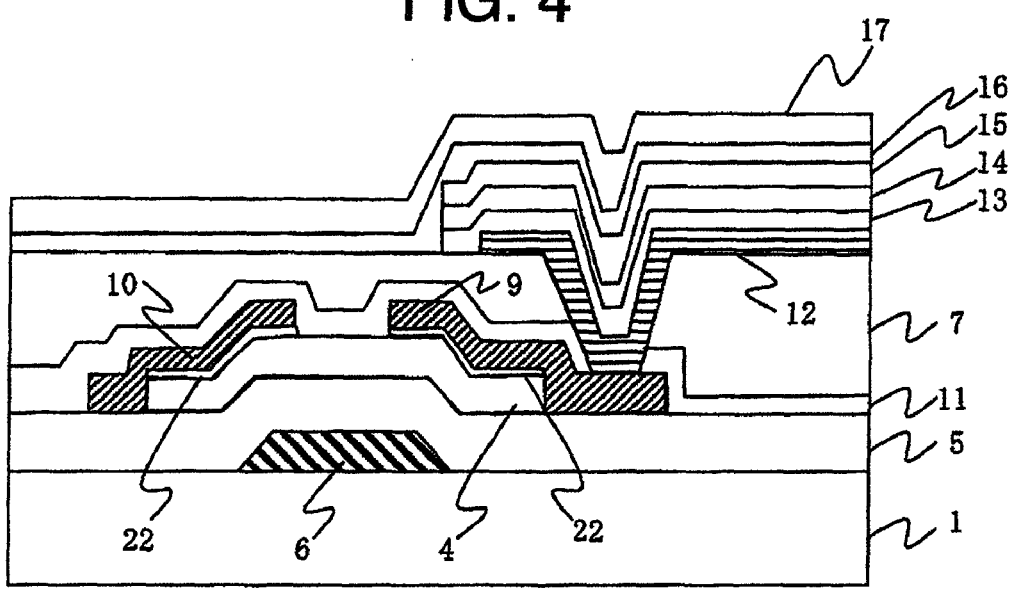
FIG. 4 is a schematic cross-sectional drawing of an organic electroluminescence display using a bottom-gate type TFT.
Figure 5:
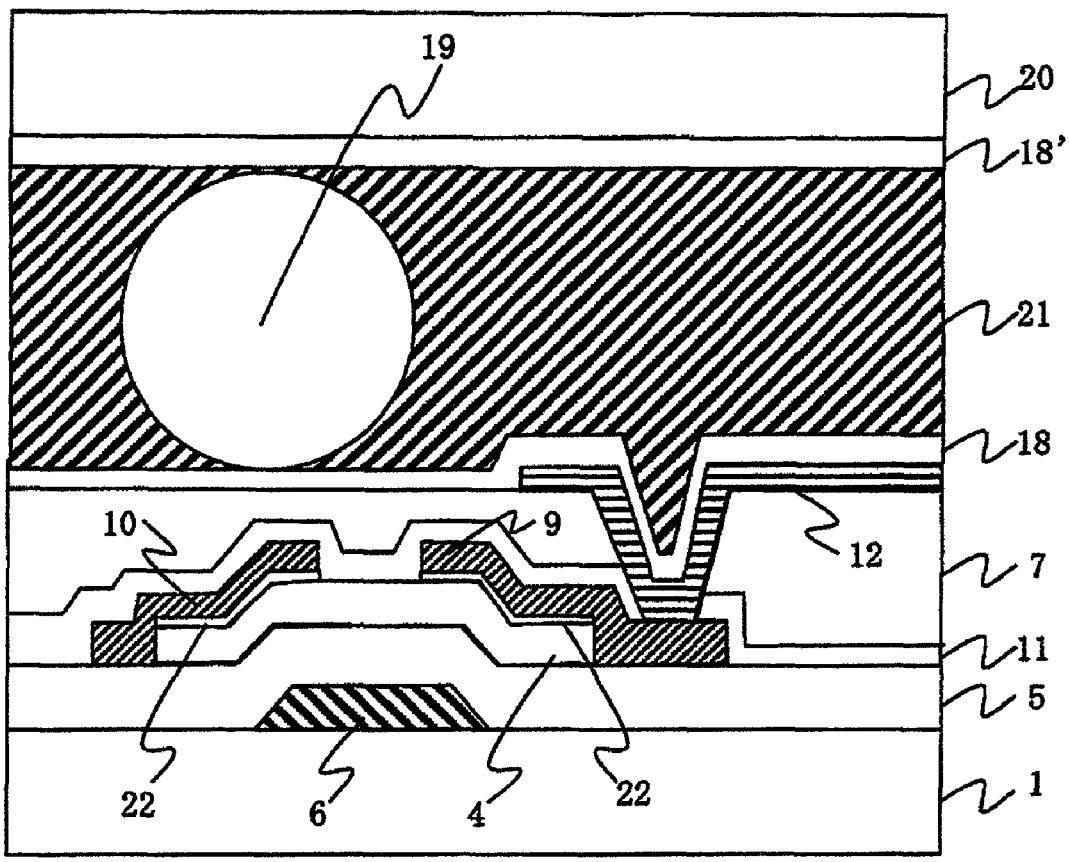
FIG. 5 is a schematic cross-sectional drawing of a liquid crystal display using a bottom-gate type TFT.

Explanation was given above on a top-gate type TFT, however, as shown in FIGS. 4 and 5, fabrication of a bottom-gate type TFT is also possible.

Embodiment 2

FIG. 2 is a schematic cross-sectional drawing of an organic electroluminescence display using the top-gate type TFT relevant to the present invention. In FIG. 2, first of all, as shown in FIG. 1, the SiN film 2 and the SiO$_2$ film 3 were formed as the base layers on the insulating substrate 1 by the PECVD method. A polycrystalline SiGe film was formed thereon as the semiconductor layer 4, by using reactive thermal CVD.

In this case, a mixed gas of Si$_2$H$_6$, GeF$_4$ and He was used. First of all, 3 sccm of Si$_2$H$_6$, 0.5 sccm of GeF$_4$ and 1 slm (=1000 sccm) of He were introduced to form crystalline nuclei. Then 3 sccm of Si$_2$H$_6$, 0.03 sccm of GeF$_4$ and 1 slm of He were introduced. The gas pressure was set to 665 Pa to grow SiGe crystal. The film thickness was 100 nm. Composition distribution evaluation by RBS showed that, in a region of equal to or less than 20 nm at the substrate side, the Ge concentration was equal to or larger than 18 atomic %, and in a region of a film thickness of equal to or larger than 40 nm, it was equal to or smaller than 13 atomic %.

In addition, according to evaluation by X-ray diffraction, in the case of a film thickness of 20 nm, it indicated a random orientation having a (220) peak intensity of 0.60 times of a (111) peak intensity, and a (311) peak intensity of 0.32 times of the (111) peak intensity. In addition, in the case of a film thickness of 100 nm, it indicated a (110) preferential orientation having a (220) peak intensity of 0.91 times of the (111) peak intensity.

This SiGe film was subjected to fabrication to an island-like shape, by using photolithography. A $SiO_2$ film was formed thereon as the gate insulating layer 5, by PECVD using TEOS. The film thickness was set to be 100 nm. Then, a Nb film was formed by a sputtering method, and fabricated to the gate electrode wiring 6, by using photolithography. A $SiO_2$ film was formed thereon as an insulating interlayer 7, by PECVD using TEOS, and contact holes were formed by using photolithography. Then, a CrMo film was formed by the sputtering method, and it was fabricated to the source electrode wiring 9 and the drain electrode wiring 10 by the photolithography method. Further, a SiN film as the protective insulating film 11 was formed thereon by using the PECVD method, and a contact hole was formed by using photolithography. Then, an Al film was formed for the pixel electrode 12, and it was fabricated by using photolithography.

The charge transport layer 13 of an organic electroluminescence, the luminescent layer 14, and the charge transport layer 15 were formed thereon by the evaporation method or the like, and further, a transparent conductive film was formed as the upper electrode 16 by the evaporation or sputtering method or the like, and a SiN film was formed as the sealing layer 17, by using Cat-CVD (Catalytic CVD) method to prepare an organic electroluminescence display. The organic electroluminescence display thus prepared showed high picture quality and long life-time image.

Embodiment 3

FIG. 3 is a schematic cross-sectional drawing of a liquid crystal display using the top-gate type TFT relevant to the present invention. In FIG. 3, by a similar method as in embodiment 1, the SiN film 2 and the $SiO_2$ film 3 were formed as base layers on the insulating substrate 1. Then a polycrystalline SiGe film was formed as the semiconductor layer 4, by using reactive thermal CVD.

In this case, a mixed gas of $Si_2H_6$, $GeF_4$ and He was used. First of all, 3 sccm of $Si_2H_6$, 0.3 sccm of $GeF_4$ and 1 slm of He were introduced to form crystalline nuclei setting gas pressure to 665 Pa, then, 3 sccm of $Si_2H_6$, 0.03 sccm of $GeF_4$ and 1 slm of He were introduced. The gas pressure was set to 1330 Pa to grow SiGe crystal. The film thickness was 100 nm. Composition distribution evaluation by RBS showed that in a region of equal to or less than 20 nm at the substrate side, the Ge concentration was equal to or larger than 15 atomic %, and in a region of a film thickness of equal to or larger than 40 nm, it was equal to or smaller than 13 atomic %.

In addition, according to evaluation by X-ray diffraction, in the case of a film thickness of 20 nm, it indicated a random orientation having a (220) peak intensity of 0.58 times of a (111) peak intensity, and a (311) peak intensity of 0.31 times of the (111) peak intensity. Also, in the case of a film thickness of 100 nm, it indicated a (111) orientation having the (111) peak intensity of 2.5 times of the (220) peak intensity.

This SiGe film was subjected to fabrication to an island-like shape, by using photolithography. By a similar method as in embodiment 1, the gate insulating layer 5, the gate electrode wiring 6, the insulating interlayer 7, the source electrode wiring 9 and the drain electrode wiring 10 were formed. Further, by a similar method as in embodiment 1, the protective insulating film 11 was formed. Then, an ITO film was formed for the pixel electrode 12, and it was fabricated by using photolithography.

An alignment film 18 was formed thereon, an opposed substrate 20 provided with an alignment film 18' via a spacer 19 was adhered, and a liquid crystal 21 was encapsulated to prepare a TFT liquid crystal display. Thus fabricated TFT liquid crystal display showed a highly fine image.

Embodiment 4

FIG. 4 is a schematic cross-sectional drawing of an organic electroluminescence display using the bottom-gate type TFT relevant to the present invention. In FIG. 4, first of all, a Nb film for the gate electrode wiring 6 was formed on the insulating substrate 1 by sputtering, and it was fabricated by using photolithography. A $SiO_2$ film was formed thereon as the gate insulating layer 5 by PECVD using TEOS. A polycrystalline SiGe film was formed thereon by using reactive thermal CVD.

In this case, a mixed gas of $Si_2H_6$, $GeF_4$ and He was used. First of all, 3 sccm of $Si_2H_6$, 0.3 sccm of $GeF_4$ and 1 slm of He were introduced to form crystalline nuclei. Then 3 sccm of $Si_2H_6$, 0.03 sccm of $GeF_4$ and 2 slm of He were introduced. The gas pressure was set to 665 Pa. The film thickness was 100 nm. Composition distribution evaluation by RBS showed that, in a region of equal to or less than 20 nm at the substrate side, the Ge concentration was equal to or larger than 15 atomic %, and in a region of a film thickness of equal to or larger than 40 nm, it was equal to or smaller than 13 atomic %. In addition, according to evaluation by X-ray diffraction, in the case of a film thickness of 20 nm, it indicated a random orientation having a (220) peak intensity of 0.58 times of a (111) peak intensity, and a (400) peak intensity of 0.6 times of the (111) peak intensity. In addition, in the case of a film thickness of 100 nm, it indicated a (100) preferential orientation having a (400) peak intensity of 0.12 times of the (111) peak intensity. Then, an n+Si film was formed as a contact layer 22 by the PECVD method. Then, the $n^+$ Si film/polycrystalline SiGe film were fabricated to an island-like shape by using photolithography.

A Nb film was formed thereon by the sputtering method, and fabricated to the source electrode wiring 9 and the drain electrode wiring 10 by using photolithography. Then, the $n^+$ Si film of the contact layer 22 was subjected to etching. Further, a SiN film was formed thereon as the protective insulating film 11 by the PECVD method, followed by formation of an organic resin as the interlayer insulating layer 7. Subsequently, a contact hole was formed at the interlayer insulating layer 7 and the protective insulating film 11 by using photolithography. Then, an Al film was formed for the pixel electrode 12 by the sputtering method, and it was fabricated by using photolithography.

The charge transport layer 13 of an organic electroluminescence, the luminescent layer 14, and the charge transport layer 15 were formed thereon by the evaporation method, and further, a transparent conductive film was formed as the upper electrode 16 by the evaporation or sputtering, and a SiN film was formed as the sealing layer 17, by using Cat-CVD method to prepare an organic electroluminescence display. The organic electroluminescence display thus prepared showed characteristics of high brightness and long life-time due to good stability of the TFT.

Embodiment 5

FIG. 5 is a schematic cross-sectional drawing of a liquid crystal display using the bottom-gate type TFT relevant to the present invention. In FIG. 5, by a similar method as in embodiment 1, the gate electrode wiring 6, the gate insulating layer 5, the semiconductor layer 4, the contact layer 22, the source electrode wiring 9, and the drain electrode wiring 10 were formed, and subsequently, the protective insulating film 11 and the insulating interlayer 7 were formed. Then, a through hole was fabricated at the interlayer insulating layer 7 and the protective insulating film 11 by using photolithography. Then an ITO film was formed for the pixel electrode 12 by the sputtering method, and it was fabricated by using photolithography.

The alignment film 18 was formed thereon, and an opposed substrate 20 provided with an alignment film 18' via a spacer 19 was adhered, and then a liquid crystal 21 was encapsulated to fabricate a TFT liquid crystal display. Thus fabricated TFT liquid crystal display showed a highly fine image.

As explained above, in the application of a polycrystalline thin film relevant to the present invention to the bottom-gate type TFT, the film is grown on a gate insulating film. By controlling the film so as to be a random orientation, the crystallization ratio of the TFT channel part can be enhanced, and mobility can be enhanced. In addition, by making the film surface side to be a structure indicating a preferential orientation, the film can be made fine, and the off-current can be reduced. Furthermore, in a back-channel etch structure, when a contact layer is subjected to etching, the etching rate of the semiconductor layer can be reduced by applying the semiconductor layer indicating the preferential orientation on the film surface side, so that a selection ratio with the contact layer can be enhanced. Therefore, the thickness of the semiconductor layer can be reduced. Also, an etching rate of the contact layer can be enhanced. Therefore, the productivity can be enhanced. Moreover, since a parasitic resistance of the TFT element can be lowered, the on-current can be increased, and because of a decrease in a volume of the semiconductor layer, thermally excited charges, and thus the off-current can also be reduced.

In the application of this film to a top-gate type TFT, the mobility can be enhanced, because the film surface side to form a TFT channel can be made of fine crystalline grains with a preferential orientation.

In order to enhance the mobility most, it is desirable to control the film to the (111) orientation. The surface charge density becomes largest at the (111) plane and becomes smaller in the order of the (110) plane and the (100) plane. A carrier runs in a parallel direction with the substrate. By adopting the (111) orientation in perpendicular to the substrate, the (100) plane or the (110) plane having low surface charge density can be faced in a parallel direction with the substrate surface, which can provide a good carrier mobility. Therefore, by controlling the preferential orientation direction to the (111) orientation, a TFT with high mobility can be provided.

On the other hand, as for the (100) plane, a good quality oxide film can be formed as compared with other planes, and as for the (110) plane, a relatively good quality oxide film can be formed. Therefore, in the case where crystal growth is controlled in the (100) orientation, defects in the back channel part of the bottom-gate type TFT, and defects in the front channel part of the top-gate type TFT can be reduced. Thus, reduction of the off-current can be effectively achieved.

Further, by controlling crystal growth in the (110) direction, preparation of a TFT having relatively good characteristics becomes also possible, with a balance between the mobility and the off-current.

The invention claimed is:

1. A thin film transistor provided with a semiconductor layer comprising a polycrystalline thin film, a source electrode, a drain electrode and a gate electrode on an insulating substrate,
wherein said thin film transistor is a bottom gate type, and
wherein said polycrystalline thin film contains Si and Ge, and a Ge concentration on the insulating substrate side of said polycrystalline thin film is higher than a Ge concentration on the side opposite to the insulating substrate side of said polycrystalline thin film.

2. The thin film transistor according to claim 1, wherein said Ge concentration is equal to or more than 10 atomic % in a region of a film thickness of equal to or smaller than 20 nm at the insulating substrate side.

3. The thin film transistor according to claim 1, wherein said Ge concentration is equal to or less than 20 atomic % in a region of a film thickness of equal to or larger than 40 nm.

4. A thin film transistor provided with a semiconductor layer comprising a polycrystalline thin film, a source electrode, a drain electrode and a gate electrode on an insulating substrate, wherein said polycrystalline thin film contains Si and Ge, and a crystalline orientation of said polycrystalline thin film indicates a random orientation in a region of a film thickness of equal to or smaller than 20 nm at the insulating substrate side, and indicates a (110) orientation at the film surface side.

5. The thin film transistor according to claim 4, wherein, as an X-ray diffraction intensity indicating said random orientation, a (220) intensity is equal to or more than 0.5 times and equal to or less than 0.7 times of a (111) intensity, and a (311) intensity is equal to or more than 0.2 times and equal to or less than 0.4 times of said (111) intensity.

6. The thin film transistor according to claim 4, wherein said (110) orientation is set so that the X-ray diffraction (220) intensity at the more front surface side than a film thickness of 40 nm is equal to or more than 0.8 times of said (111) intensity.

7. The thin film transistor according to claim 4, wherein said Ge concentration is higher at the insulating substrate side.

8. An organic electroluminescence display provided with a thin film transistor comprising a polycrystalline thin film, a source electrode, a drain electrode and a gate electrode on an insulating substrate,
wherein said thin film transistor is a bottom gate type, and
wherein said polycrystalline thin film contains Si and Ge, and a Ge concentration on the insulating substrate side of said polycrystalline thin film is higher than a Ge concentration on the side opposite to the insulating substrate side of said polycrystalline thin film.

9. An organic electroluminescence display provided with a semiconductor layer comprising a polycrystalline thin film, a source electrode, a drain electrode and a gate electrode on an insulating substrate, wherein said polycrystalline thin film contains Si and Ge, and crystalline orientation of said polycrystalline thin film indicates a random orientation in a region of a film thickness of 20 nm at the insulating substrate side, and indicates a (110) orientation at the film surface side.

* * * * *